United States Patent
Onishi

(10) Patent No.: US 7,358,813 B2
(45) Date of Patent: Apr. 15, 2008

(54) DIFFERENTIAL OPERATIONAL AMPLIFIER

(75) Inventor: Akinobu Onishi, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 77 days.

(21) Appl. No.: 11/531,207

(22) Filed: Sep. 12, 2006

(65) Prior Publication Data

US 2007/0057727 A1  Mar. 15, 2007

(30) Foreign Application Priority Data

Sep. 12, 2005  (JP) .............................. 2005-264287

(51) Int. Cl.
*H03F 3/45* (2006.01)
(52) U.S. Cl. ..................................... 330/258; 330/261
(58) Field of Classification Search ................ 330/253, 330/257, 258, 261
See application file for complete search history.

(56) References Cited

U.S. PATENT DOCUMENTS 4,518,870 A * 5/1985 Banu ........................... 327/73
7,088,181 B1 * 8/2006 Voo ............................ 330/258
7,145,384 B2 * 12/2006 Point et al. ..................... 330/9
7,215,199 B2 * 5/2007 Marholev ................... 330/258

FOREIGN PATENT DOCUMENTS

JP        07-86850       3/1995

* cited by examiner

*Primary Examiner*—Henry Choe
(74) *Attorney, Agent, or Firm*—SoCal IP Law Group LLP; Steven C. Sereboff

(57) ABSTRACT

Disclosed is a differential operational amplifier that outputs first and second output voltages corresponding to first and second input voltages, the amplifier comprising a differential circuit that operates depending on the first and second input voltages; a control voltage generation circuit that generates a control voltage for making an intermediate voltage of the first and second output voltages become a predetermined reference voltage; a variable current generation circuit that is connected serially to the differential circuit to generate a variable current corresponding to the control voltage; and a constant current generation circuit that is connected in parallel with the variable current generation circuit to generate a constant current, control being performed with the variable current and the constant current such that the intermediate voltage turns to the reference voltage.

6 Claims, 7 Drawing Sheets

DIFFERENTIAL OPERATIONAL AMPLIFIER

CROSS-REFERENCE TO RELATED APPLICATION

This application claims the benefit of priority to Japanese Patent Application No. 2005-264287, filed Sep. 12, 2005, of which full contents are incorporated herein by reference.

BACKGROUND OF THE INVENTION

1. Field of the Invention

The present invention relates to a differential operational amplifier.

2. Description of the Related Art

A differential operational amplifier is generally used for an operational amplifier with increased noise resistance (see, e.g., Japanese Patent Application Laid-Open Publication No. 1995-86850). FIG. 9 shows a typical configuration of a differential operational amplifier. A differential operational amplifier 100 is constituted by including P-MOSFETs 101 to 108, N-MOSFETs 109 to 112, and a common-mode feedback circuit (CMFB circuit) 115.

A bias voltage VB3 is applied to the gates of the P-MOSFETs 101 to 103 and a bias voltage VB2 is applied to the gates of the P-MOSFETs 104 to 106 to constitute a current source in the differential operational amplifier 100. A bias voltage VB1 is applied to the gates of the N-MOSFETs 109, 110 serially connected to the P-MOSFETs 104, 106.

An electric potential between the P-MOSFET 104 and the N-MOSFET 109 is an output voltage VOUTP, which is one differential output, and an electric potential between the P-MOSFET 106 and the N-MOSFET 110 is an output voltage VOUTN, which is the other differential output.

The P-MOSFETs 107, 108 are serially connected to the P-MOSFETs 102, 105 and constitute a differential circuit. One differential input, i.e., an input voltage VINP is applied to the gate of the P-MOSFET 107, and the other differential input, i.e., an input voltage VINN is applied to the gate of the P-MOSFET 108. That is, the differential outputs VOUTP, VOUTN are changed depending on the differential inputs VINP, VINN.

The N-MOSFETs 111, 112 are serially connected to the P-MOSFETs 107, 108 and the N-MOSFETs 1019, 110, and a control voltage VBC output from the common-mode feedback circuit 115 is applied to the gates of the N-MOSFETs 111, 112.

The common-mode feedback circuit 115 controls and outputs the control voltage VBC such that a common-mode voltage (intermediate voltage) of the output voltages VOUTP, VOUTN of the operational amplifier 100 becomes a reference voltage COMVREF. That is, if the common-mode voltage VC is higher than the reference voltage COMVREF, the control voltage VBC is raised. Since the raising of the control voltage VBC increases the drain currents of the N-MOSFETs 111, 112, the output voltages VOUTP, VOUTN are lowered and the common-mode voltage VC is also lowered. Contrary, if the common-mode voltage VC is lower than the reference voltage COMVREF, the control voltage VBC is lowered. Since the lowering of the control voltage VBC decreases the drain currents of the N-MOSFETs 111, 112, the output voltages VOUTP, VOUTN are raised and the common-mode voltage VC is also raised.

In this way, the operational amplifier 100 is controlled such that the common-mode voltage VC of the output voltages VOUTP, VOUTN becomes the predetermined reference voltage COMVREF by controlling the voltage VBC applied to the gates of the N-MOSFETs 111, 112.

In the operational amplifier 100, the gate capacities of the N-MOSFETs 111, 112 are generally increased to reduce 1/f noise. FIG. 10 shows a typical configuration example of the N-MOSFET 111. To increase the gate capacity, as shown in FIG. 10, the N-MOSFET 111 can be constituted by connecting, for example, 10 N-MOSFETs 111a to 111j of a certain size in parallel. The N-MOSFET 112 has the configuration same as the N-MOSFET 111.

When the input voltages VINP, VINN input to the operational amplifier 100 have large amplitude, the fluctuations of the output voltages become large and the swing of the common-mode voltage VC becomes large. When the swing of the common-mode voltage VC is large, the fluctuation band of the control voltage VBC becomes large. When the fluctuation band of the control voltage VBC becomes large, the change amounts are increased in the drain currents of the N-MOSFETs 111, 112 and the current change amount is increased in the operational amplifier 100. Therefore, if the amplitude of the input voltages VINP, VINN is large, the distortion rate of the operational amplifier 100 is deteriorated.

Since the gate capacities of the N-MOSFETs 111, 112 are large, the current amount must be increased in the common-mode feedback circuit 115 to steadily operate the common-mode feedback circuit 115, and the current consumption of the operational amplifier 100 is increased.

SUMMARY OF THE INVENTION

The present invention was conceived in consideration of the above problems and it is therefore the object of the present invention to provide a differential operational amplifier that can constrain deterioration of a distortion rate and reduce power consumption.

In order to achieve the above object, according to a major aspect of the present invention there is provided a differential operational amplifier that outputs first and second output voltages corresponding to first and second input voltages, the amplifier comprising a differential circuit that operates depending on the first and second input voltages; a control voltage generation circuit that generates a control voltage for making an intermediate voltage of the first and second output voltages become a predetermined reference voltage; a variable current generation circuit that is connected serially to the differential circuit to generate a variable current corresponding to the control voltage; and a constant current generation circuit that is connected in parallel with the variable current generation circuit to generate a constant current, control being performed with the variable current and the constant current such that the intermediate voltage turns to the reference voltage.

The differential circuit may include a first transistor that has a control electrode to which the first input voltage is applied; and a second transistor that has a control electrode to which the second input voltage is applied. The variable current generation circuit may include a third transistor that is connected serially to the first transistor, the third transistor having a control electrode to which the control voltage is applied; and a fourth transistor that is connected serially to the second transistor, the fourth transistor having a control electrode to which the control voltage is applied. The constant current generation circuit may include a fifth transistor that is connected in parallel with the third transistor, the fifth transistor having a control electrode to which a predetermined constant voltage is applied; and a sixth transistor that is connected in parallel with the fourth transistor, the sixth transistor having a control electrode to which the constant voltage is applied.

The current driving capability of the variable current generation circuit is preferably smaller than the current driving capability of the constant current generation circuit.

The constant current generation circuit may include a first number of transistors of a predetermined size connected in parallel. The variable current generation circuit may include a second number of the transistors connected in parallel, which second number is equal to or less than the first number.

Other features of the present invention will become apparent from the accompanying drawings and description in the specification.

BRIEF DESCRIPTION OF THE DRAWINGS

To understand the present invention and the advantages thereof more thoroughly, the following description should be referenced along with the accompanying drawings.

DETAILED DESCRIPTION OF THE INVENTION

From the contents of the description and the accompanying drawings, at least the following details will become apparent.

DIFFERENTIAL OPERATIONAL AMPLIFIER

Figure 1:
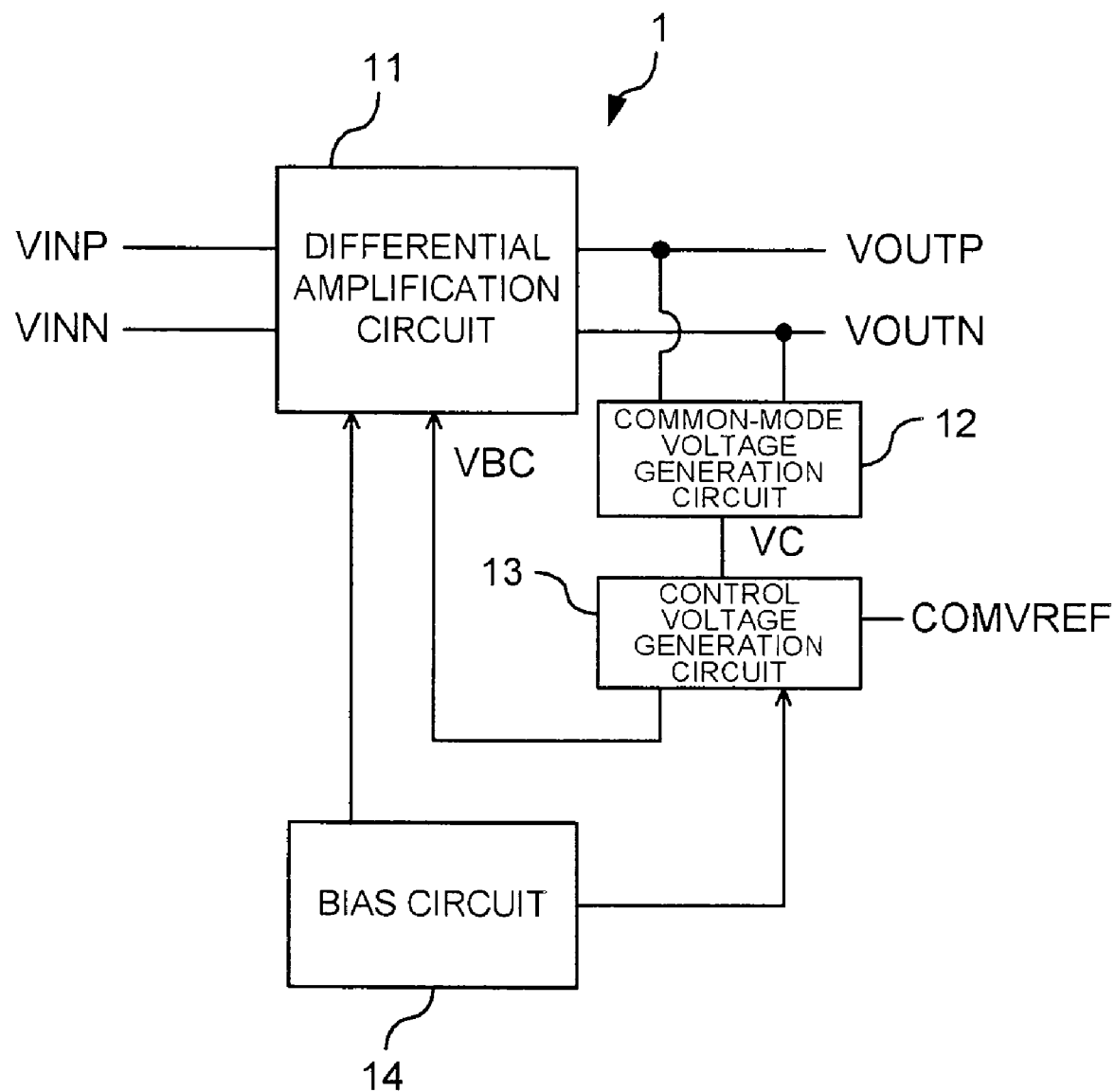
FIG. 1 shows an outline configuration of a differential operational amplifier of the present invention.

FIG. 1 shows an outline configuration of a differential operational amplifier of the present invention. A differential operational amplifier 1 includes a differential amplification circuit 11, a common-mode voltage generation circuit 12, a control voltage generation circuit 13, and a bias circuit 14.

The differential amplification circuit 11 outputs differential outputs VOUTP (a first output voltage), VOUTN (a second output voltage) corresponding to differential inputs VINP (a first input voltage), VINN (a second input voltage). The common-mode voltage generation circuit 12 and the control voltage generation circuit 13 are a common-mode feedback circuit that performs control such that a common-mode voltage (intermediate voltage) of the differential outputs VOUTP, VOUTN becomes a predetermined reference voltage. The common-mode voltage generation circuit 12 generates and outputs the common-mode voltage VC of the differential outputs VOUTP, VOUTN. The control voltage generation circuit 13 compares the common-mode voltage VC and the predetermined reference voltage COMVREF and controls and outputs the control voltage VBC to the differential amplification circuit 11 such that the common-mode voltage VC becomes the reference voltage COMVREF. The bias circuit 14 is a circuit that generates a bias voltage for driving the differential amplification circuit 11 and the control voltage generation circuit 13.

Figure 2:
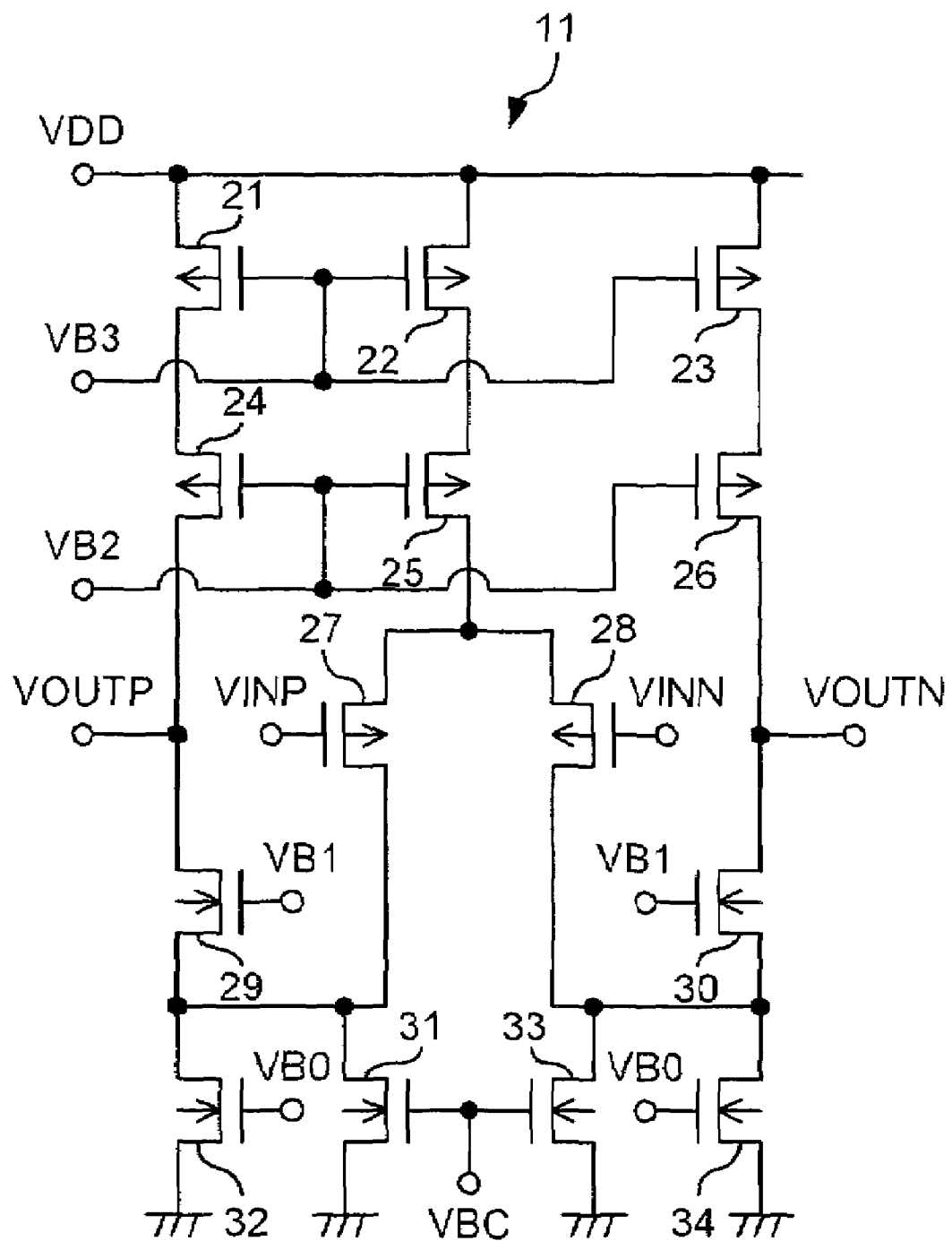
FIG. 2 shows a configuration example of a differential amplification circuit.

FIG. 2 shows a configuration example of the differential amplification circuit 11. The differential amplification circuit 11 includes P-MOSFETs 21 to 28 and N-MOSFETs 29 to 34.

A bias voltage VB3 output from the bias circuit 14 is applied to the gates of the P-MOSFETs to 23 and a bias voltage VB2 output from the bias circuit 14 is applied to the P-MOSFETs 24 to 26. The P-MOSFETs to 23 and the P-MOSFETs 24 to 26 are connected serially to act as a current source.

The P-MOSFETs 27, 28 constitute a differential circuit; one differential input, i.e., the input voltage VINP is applied to the gate of the P-MOSFET 27 (a first transistor); and the other differential input, i.e., the input voltage VINN is applied to the gate of the P-MOSFET (a second transistor). That is, although the currents flowing through the P-MOSFETs 27, 28 are equal when the input voltage VINP is equal to the input voltage VINN, if the input voltage VINP is smaller than the input voltage VINN, more current flows through the P-MOSFET 27 than the P-MOSFET 28.

The N-MOSFETs 29, 30 are serially connected to the P-MOSFETs 24, 26 and a bias voltage VB1 is applied to the gates of the N-MOSFETs 29, 30. An electric potential between the P-MOSFET 24 and the N-MOSFET is the output voltage VOUTP, which is one differential output, and an electric potential between the P-MOSFET 26 and the N-MOSFET 30 is the output voltage VOUTN, which is the other differential output. The differential outputs VOUTP, VOUTN are changed depending on the differential inputs VINP, VINN.

The N-MOSFET 31 (a third transistor) is serially connected to the P-MOSFET 27, and the N-MOSFET 33 (a fourth transistor) is serially connected to the P-MOSFET 28. The N-MOSFET 32 (a fifth transistor) is connected in parallel with the N-MOSFET 31, and the N-MOSFET 34 (a sixth transistor) is connected in parallel with the N-MOSFET 33. The control voltage VBC output from the control voltage generation circuit 13 is applied to the gates of the N-MOSFETs 31, 33, and a bias voltage VB0 output from the bias circuit 14 is applied to the gates of the N-MOSFETs 32, 34. Therefore, the drain currents of the N-MOSFETs 31, 33 are variable currents varied depending on the control voltage VBC, and the drain currents of the N-MOSFETs 32, 34 are constant currents.

Under the control of the common-mode voltage generation circuit 12 and the control voltage generation circuit 13, the control voltage VBC applied to the gates of the N-MOSFETs 31, 33 is raised when the common-mode voltage VC is higher than the reference voltage COMVREF and is lowered when the common-mode voltage VC is lower than the reference voltage COMVREF. When the control voltage VBC is raised, the drain currents of the N-MOSFETs 31, 33 are increased; the output voltages VOUTP, VOUTN are lowered; and the common-mode voltage VC is also lowered. When the control voltage VBC is lowered, the drain currents of the N-MOSFETs 31, 33 are decreased; the output voltages VOUTP, VOUTN are raised; and the common-mode voltage VC is also raised. In this way, the differential amplification circuit 11 is controlled such that the common-mode voltage VC becomes the reference voltage COMVREF.

The N-MOSFETs 31, 33 correspond to a variable current generation circuit of the present invention, and the N-MOS- FETs 32, 34 correspond to a constant current generation circuit of the present invention. When the common-mode voltage VC is equal to the reference voltage COMVREF, the control voltage VBC is equal to the bias voltage VB0 applied to the gates of the N-MOSFETs 32, 34.

Figure 3:
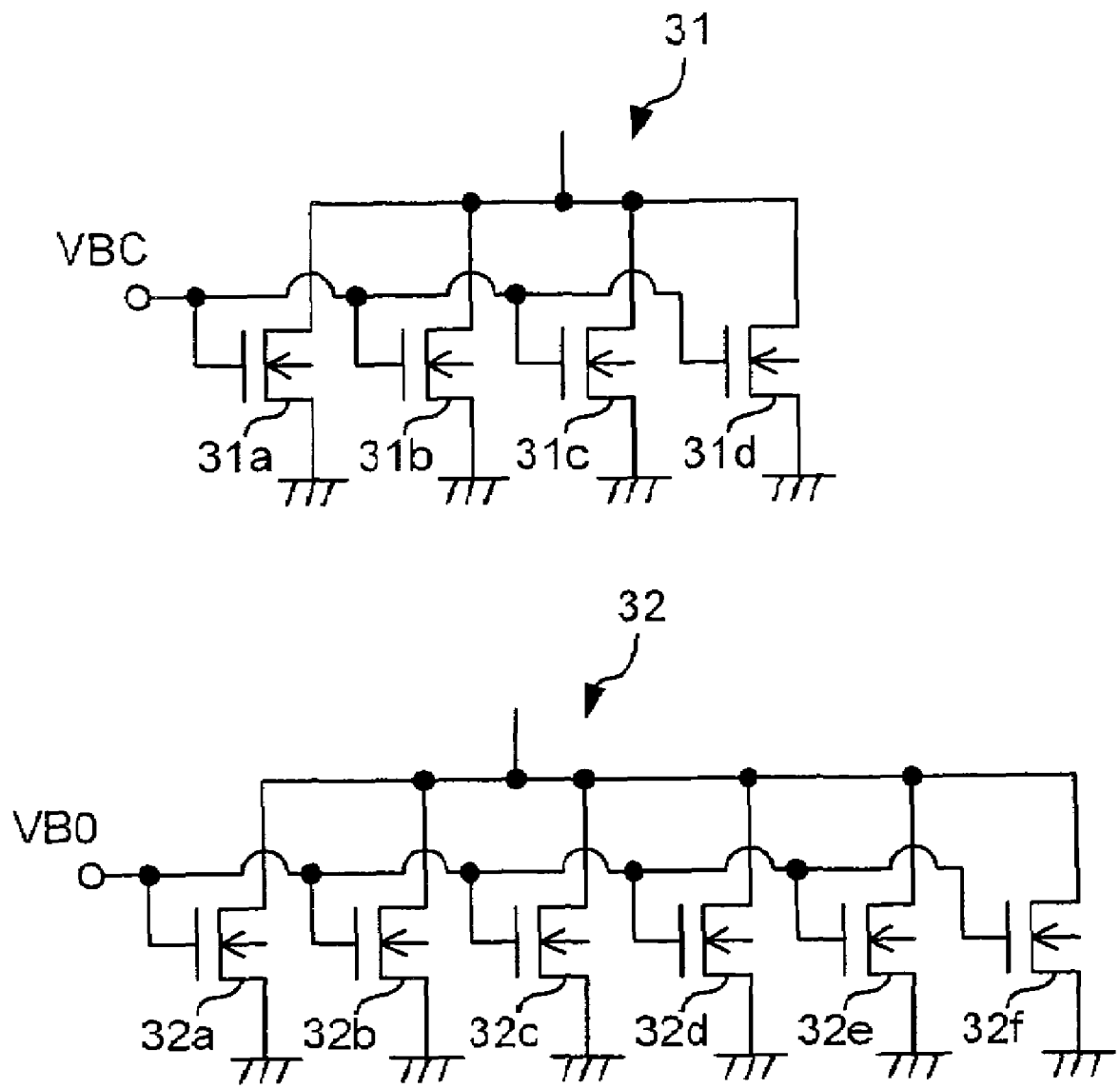
FIG. 3 shows a configuration example of N-MOSFETs.

FIG. 3 shows a configuration example of the N-MOSFETs 31, 32. As shown in FIG. 3, the N-MOSFET 31 can be constituted by connecting, for example, four (a second number of) N-MOSFETs 31a to 31d of a certain size in parallel. The N-MOSFET 32 can be constituted by connecting, for example, six (a first number of) N-MOSFETs 32a to 32f of the size same as the N-MOSFET 31a in parallel. Therefore, if the control voltage VBC is equal to the bias voltage VB0, the drain current of the N-MOSFET 31 is smaller than the drain current of the N-MOSFET 32. That is, the current driving capability of the N-MOSFET 31 is smaller than the driving capability of the N-MOSFET 32.

Although the current driving capability of the N-MOSFET 31 is made smaller than the current driving capability of the N-MOSFET 32 due to the number of the same-size N-MOSFETs connected in parallel in the embodiment, this does not limit the method of making the current driving capability smaller. For example, if the N-MOSFETs 31, 32 include the same numbers of the N-MOSFETs, the current driving capability of the N-MOSFET 31 can be made smaller than that of the N-MOSFET 32 by making the size of the N-MOSFET 31 smaller than the size of the N-MOSFET 32.

Figure 4:
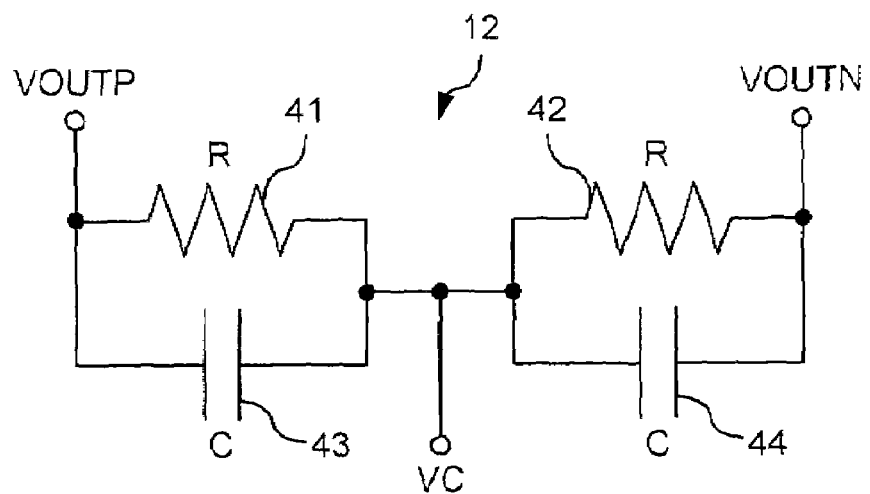
FIG. 4 shows a configuration example of a common-mode voltage generation circuit.

FIG. 4 shows a configuration example of the common-mode voltage generation circuit 12. The common-mode voltage generation circuit 12 includes two resistors 41, 42 with the same resistance value and two capacitors 43, 44 with the same capacity. The resistor 41 and the capacitor 43 are connected in parallel and the output voltage VOUTP is applied to one end thereof. The resistor 42 and the capacitor 44 are connected in parallel and the output voltage VOUTN is applied to one end thereof. The resistor 41 and the capacitor 43 are serially connected to the resistor 42 and the capacitor 44, and a voltage at the connection point is the common-mode voltage VC. A switched capacitor can be used instead of the resistors 41, 42.

Figure 5:
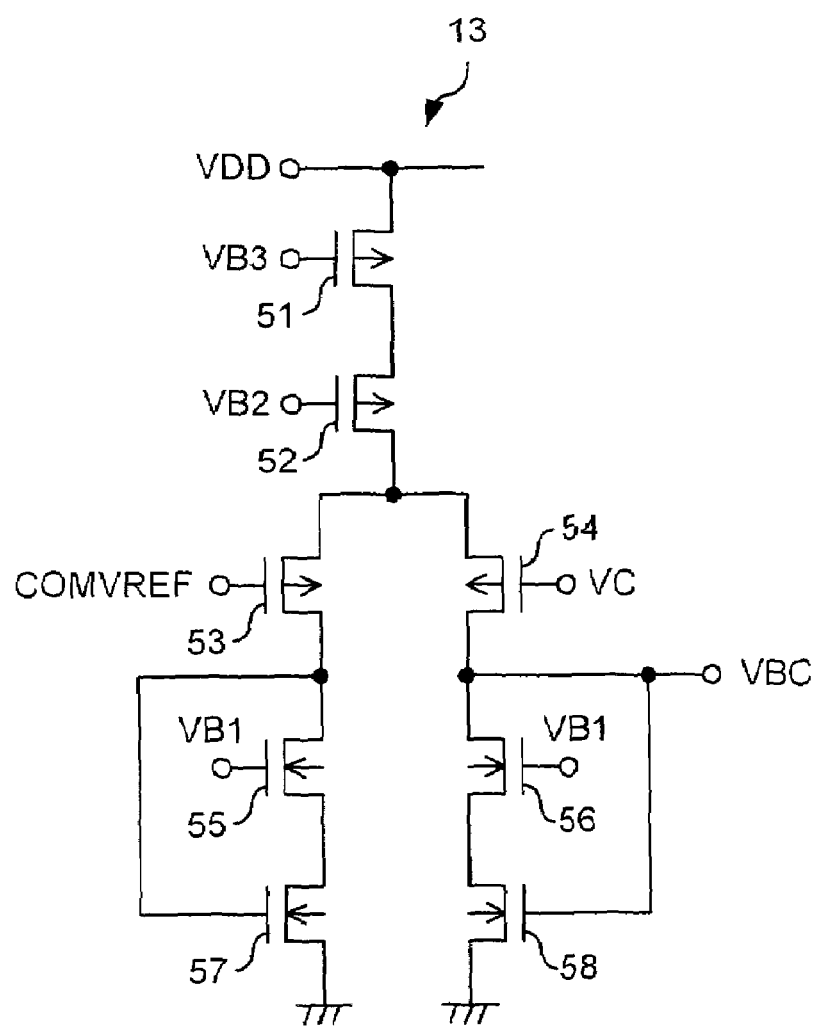
FIG. 5 shows a configuration example of a control voltage generation circuit.

FIG. 5 shows a configuration example of the control voltage generation circuit 13. The control voltage generation circuit 13 includes P-MOSFETs 51 to 54 and N-MOSFETs 55 to 58. The bias voltage VB3 output from the bias circuit 14 is applied to the gate of the P-MOSFET 51. The P-MOSFET 52 is serially connected to the P-MOSFET 51 and the bias voltage VB2 output from the bias circuit 14 is applied to the gate of the P-MOSFET 52. That is, the P-MOSFETs 51, 52 constitute a current source in the control voltage generation circuit 13.

The P-MOSFETs 53, 54 constitute a differential circuit; the reference voltage COMVREF is applied to the gate of the P-MOSFET 53; and the common-mode voltage VC is applied to the gate of the P-MOSFET 54. The N-MOSFETs 55, 56 are serially connected to the P-MOSFETs 53, 54 and the bias voltage VB1 output from the bias circuit 14 is applied to the gates of the N-MOSFETs 55, 56. The N-MOSFETs 57, 58 are serially connected to the N-MOSFETs 55, 56; a voltage at the connection point of the P-MOSFET 53 and the N-MOSFET 55 is applied to the gate of the N-MOSFET 57; and a voltage at the connection point of the P-MOSFET 54 and the N-MOSFET 56 is applied to the gate of the N-MOSFET 58. The voltage applied to the gate of the N-MOSFET 58 is the control voltage VBC, which is the output of the control voltage generation circuit 13.

In such a control voltage generation circuit 13, when the common-mode voltage VC is higher than the reference voltage COMVREF, the drain current of the P-MOSFET 54 becomes smaller than the drain current of the P-MOSFET 53 and the control voltage VBC is raised. Contrary, when the common-mode voltage VC is lower than the reference voltage COMVREF, the drain current of the P-MOSFET 54 becomes larger than the drain current of the P-MOSFET 53 and the control voltage VBC is lowered.

Figure 6:
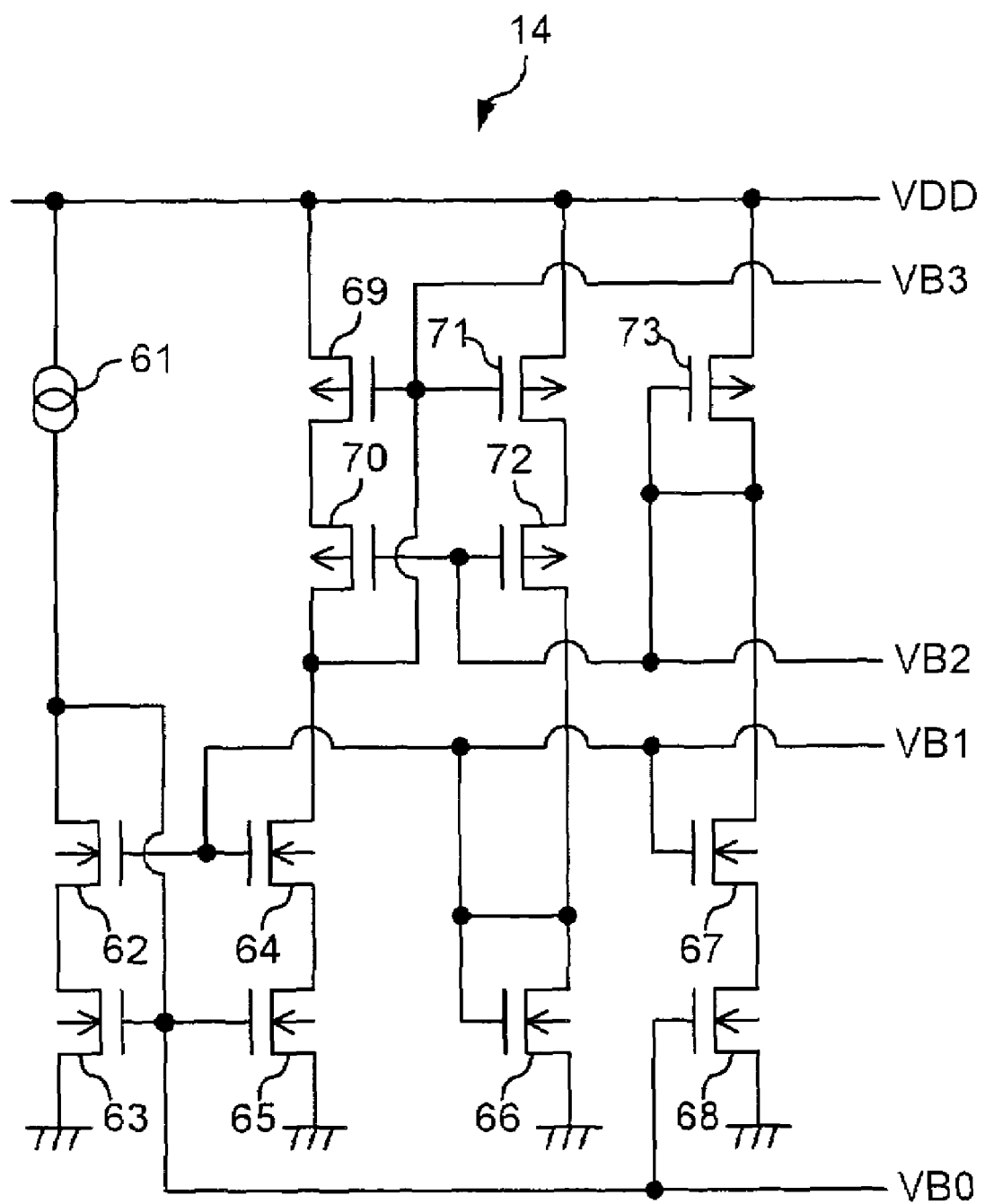
FIG. 6 shows a configuration example of a bias circuit.

FIG. 6 shows a configuration example of the bias circuit 14. The bias circuit 14 includes a constant current source 61, N-MOSFETs 62 to 68, and P-MOSFETs 69 to 73. The N-MOSFETs 62 to 65 and the P-MOSFETs 69 to 72 form cascode current mirror circuits.

A voltage at the connection point of the constant current source 61 and the N-MOSFET 62 is applied to the gates of the N-MOSFETs 63, 65, and this voltage is the bias voltage VB0. The bias voltage VB0 is also applied to the gate of the N-MOSFET 68.

The N-MOSFET 66 is diode-connected to apply a voltage at the gate and drain to the gates of the N-MOSFETs 62, 64, and this voltage is the bias voltage VB1. The bias voltage VB1 is applied to the gate of the N-MOSFET 67 serially connected to the N-MOSFET 68.

The P-MOSFET 73 is diode-connected and serially connected to the N-MOSFET 67. A voltage at the gate and drain of the P-MOSFET 73 is applied to the gates of the P-MOSFETs 70, 72, and this voltage is the bias voltage VB2. A voltage at the connection point of the P-MOSFET 70 and the N-MOSFET 64 is applied to the gates of the P-MOSFETs 69, 71, and this voltage is the bias voltage VB3.

In this way, the bias voltage generation circuit 14 generates the bias voltages VB0 to VB3 for driving the differential amplification circuit 11 and the control voltage generation circuit 13.

Description has been made of the differential operational amplifier 1 of the embodiment of the present invention. As described above, in the differential amplification circuit 11, the N-MOSFETs 31, 32 connected in parallel are serially connected to the P-MOSFET 27 that is one of the transistors constituting the differential circuit. The N-MOSFETs 33, 34 connected in parallel are serially connected to the P-MOSFET that is the other transistor constituting the differential circuit. The predetermined bias voltage VB0 is applied to the gates of the N-MOSFETs 32, 34, and the control voltage VBC is applied to the gates of the N-MOSFETs 31, 33.

Therefore, when the control voltage VBC is changed, the drain currents of the N-MOSFETs 31, 33 change and the drain currents of the N-MOSFETs 32, 34 do not change. Therefore, as compared to the case that the control voltage VBC is applied to all the gates of the N-MOSFETs 31 to 34, the current change amount is reduced in the differential amplification circuit 11. That is, although the fluctuations of the output voltages VOUT, VOUTN become large and the fluctuation band of the control voltage VBC becomes large correspondingly when the input voltages VINP, VINN of the operational amplifier 1 have large amplitude, the deterioration of the distortion rate is constrained since the current change amount is reduced in the operational amplifier 1.

The feedback current from the control voltage generation circuit 13 to the differential amplification circuit 11 flows only into the N-MOSFETs 31, 33. Therefore, as compared to the case that the feedback current flows into all the N-MOSFETs 31 to 34, the gate capacity is reduced from the viewpoint of the control voltage generation circuit 13. Therefore, the current amount necessary for ensuring a phase margin can be reduced in the control voltage generation circuit 13 and the current consumption is reduced in the operational amplifier 1.

As shown in the embodiment, by making the current driving capabilities of the N-MOSFETs 31, 33 smaller than the current driving capabilities of the N-MOSFETs 32, 34, the current change amount constraint effect due to the change in the control voltage VBC is enhanced to constrain the deterioration of the distortion rate.

Since the current change amount is constrained in the differential amplification circuit 11, the swing of the output voltages VOUTP, VOUTN is also constrained and the settling time of the operational amplifier 1 is reduced. Therefore, integration accuracy can be improved by constituting an integrator with the use of the operational amplifier 1.

Figure 7:
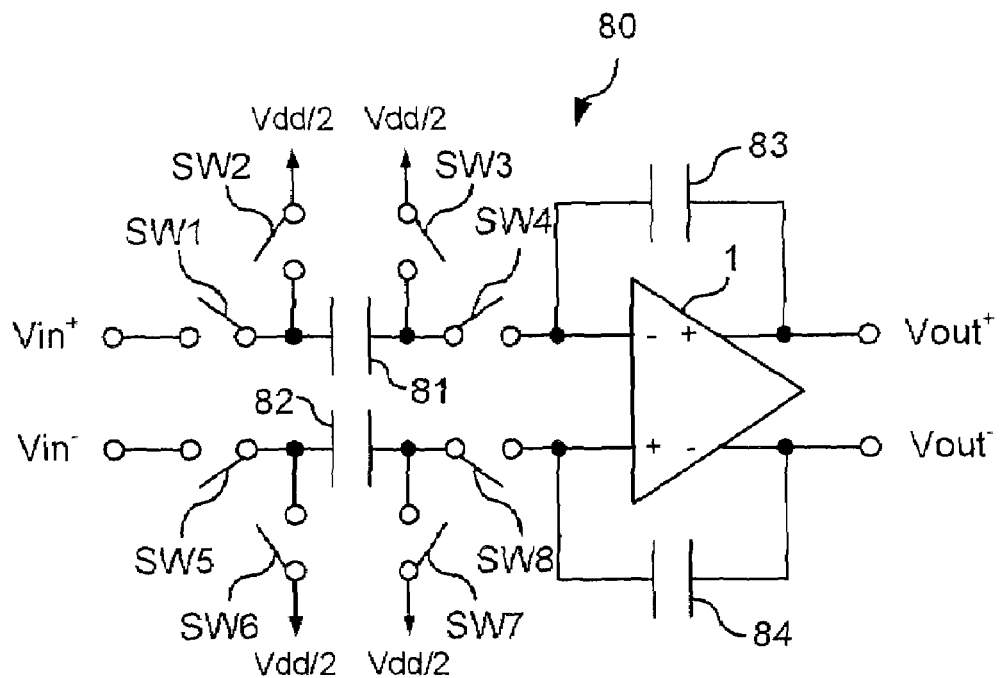
FIG. 7 shows a configuration example of an integrator using the operational amplifier.

FIG. 7 shows a configuration example of an integrator using the operational amplifier 1. An integrator 80 includes an operational amplifier 1, capacitors 81 to 84, and switch circuits SW1 to SW8. The switch circuits SW1 to SW4 and the capacitor 81 constitute a switched capacitor and, similarly, the switch circuits SW5 to SW8 and the capacitor 82 constitute a switched capacitor.

Figure 8:
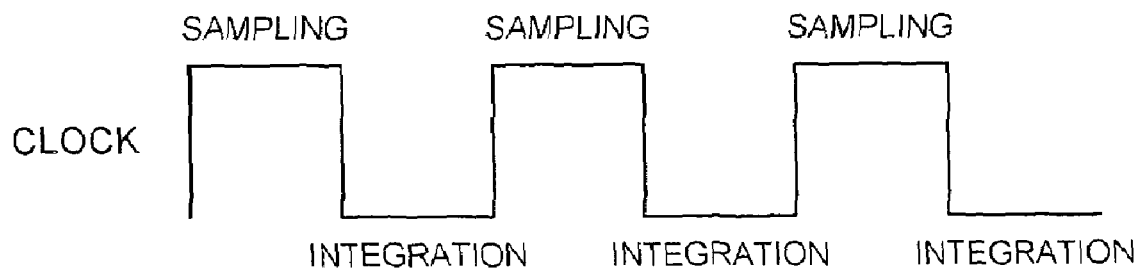
FIG. 8 is a timing chart of the operation of the integrator.
Figure 8:
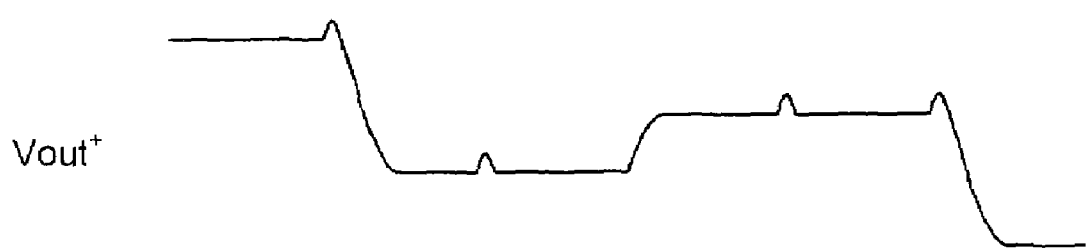
Figure 9:
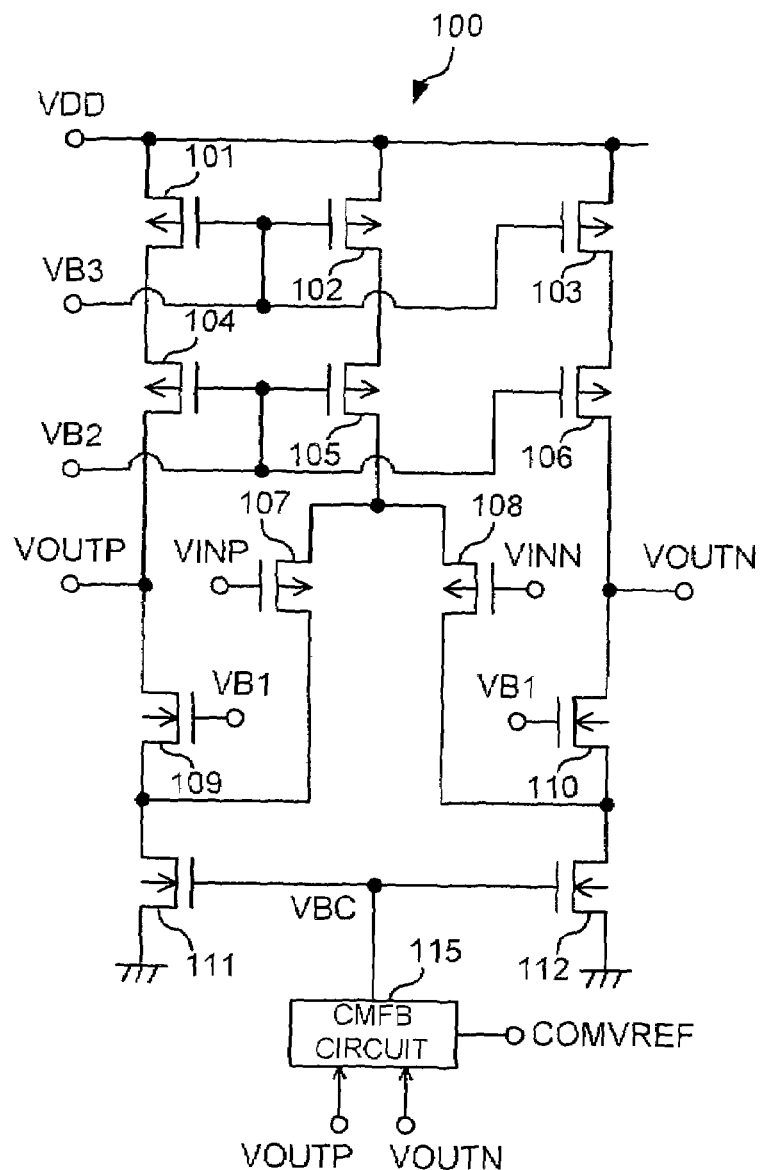
FIG. 9 shows a typical configuration of a differential operational amplifier.
Figure 10:
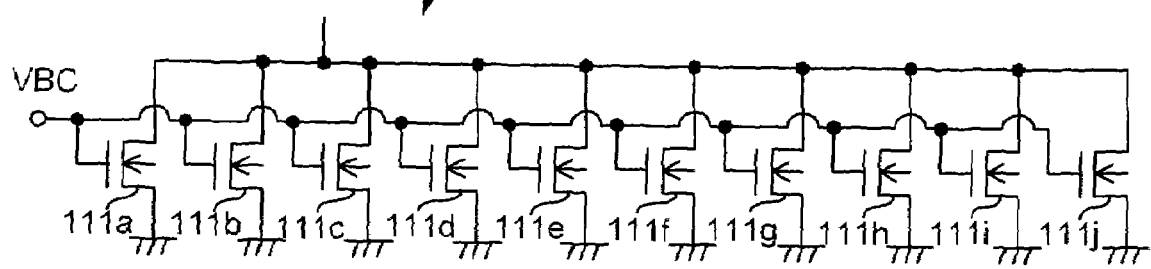
FIG. 10 shows a typical configuration example of the N-MOSFET.

FIG. 8 is a timing chart of the operation of the integrator 80. As shown in FIG. 8, when a clock signal CLOCK is H-level, the switch circuits SW1, SW3 are turned on; the switch circuits SW2, SW4 are turned off; and the capacitor 81 samples one input voltage $Vin^+$. When the clock signal CLOCK is L-level, the switch circuits SW1, SW3 are turned off; the switch circuits SW2, SW4 are turned on; and the sampled electric charge is accumulated in the capacitor 83 to perform integration. Similarly, the integration is performed for the other input voltage $Vin^-$.

To improve the integration accuracy in the integrator 80, the integration must be completed in an integration period. That is, output voltages $Vout^+$, $Vout^-$ must become steady-state while the clock signal is L-level. Since the operational amplifier 1 has the short settling time, time required for the integration is reduced in the integrator 80. Therefore, even when the integrator 80 is operated at a higher frequency, the integration can be certainly performed and the integration accuracy can be improved.

The aforementioned embodiment is for the purpose of facilitating the understanding of the present invention and not for the purpose of construing the present invention in a limited manner. The present invention may be changed/altered without departing from the spirit thereof and includes the equivalents thereof.

For example, although the embodiment uses the configuration of the differential amplification circuit shown in FIG. 2, the differential amplification circuit is not limited to this configuration and may be any configuration that has a transistor to which the control voltage VBC is applied. The same effect as the operational amplifier 1 of the embodiment can be achieved by disposing a transistor to which a predetermined voltage (VB0 in the embodiment) is applied in parallel with the transistor to which the control voltage VBC is applied.

What is claimed is:

1. A differential operational amplifier that outputs first and second output voltages corresponding to first and second input voltages, the amplifier comprising:
   a differential circuit that operates depending on the first and second input voltages;
   a control voltage generation circuit that generates a control voltage for making an intermediate voltage of the first and second output voltages become a predetermined reference voltage;
   a variable current generation circuit that is connected serially to the differential circuit to generate a variable current corresponding to the control voltage; and
   a constant current generation circuit that is connected in parallel with the variable current generation circuit to generate a constant current,
   control being performed with the variable current and the constant current such that the intermediate voltage turns to the reference voltage.

2. The differential operational amplifier of claim 1, wherein
   the differential circuit includes:
   a first transistor that has a control electrode to which the first input voltage is applied; and
   a second transistor that has a control electrode to which the second input voltage is applied, wherein
   the variable current generation circuit includes:
   a third transistor that is connected serially to the first transistor, the third transistor having a control electrode to which the control voltage is applied; and
   a fourth transistor that is connected serially to the second transistor, the fourth transistor having a control electrode to which the control voltage is applied, and wherein
   the constant current generation circuit includes:
   a fifth transistor that is connected in parallel with the third transistor, the fifth transistor having a control electrode to which a predetermined constant voltage is applied; and
   a sixth transistor that is connected in parallel with the fourth transistor, the sixth transistor having a control electrode to which the constant voltage is applied.

3. The differential operational amplifier of claim 1, wherein
   the current driving capability of the variable current generation circuit is smaller than the current driving capability of the constant current generation circuit.

4. The differential operational amplifier of claim 3, wherein
   the constant current generation circuit includes a first number of transistors of a predetermined size connected in parallel, and wherein
   the variable current generation circuit includes a second number of the transistors connected in parallel, which second number is equal to or less than the first number.

5. The differential operational amplifier of claim 2, wherein
   the current driving capability of the variable current generation circuit is smaller than the current driving capability of the constant current generation circuit.

6. The differential operational amplifier of claim 5, wherein
   the constant current generation circuit includes a first number of transistors of a predetermined size connected in parallel, and wherein
   the variable current generation circuit includes a second number of the transistors connected in parallel, which second number is equal to or less than the first number.

* * * * *